(12) United States Patent
Liu et al.

(10) Patent No.: US 11,075,282 B2
(45) Date of Patent: Jul. 27, 2021

(54) SEMICONDUCTOR STRUCTURE AND FABRICATION METHOD THEREOF

(71) Applicant: TAIWAN SEMICONDUCTOR MANUFACTURING CO., LTD., Hsinchu (TW)

(72) Inventors: Kuo-An Liu, Hsinchu (TW); Chan-Lon Yang, Taipei (TW); Bharath Kumar Pulicherla, Hsinchu (TW); Zhi-Qiang Wu, Hsinchu County (TW); Chung-Cheng Wu, Hsinchu County (TW); Chih-Han Lin, Hsinchu (TW); Gwan-Sin Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/689,033

(22) Filed: Nov. 19, 2019

(65) Prior Publication Data
US 2020/0111893 A1 Apr. 9, 2020

Related U.S. Application Data

(63) Continuation of application No. 16/007,885, filed on Jun. 13, 2018, now Pat. No. 10,510,866.

(51) Int. Cl.
*H01L 29/66* (2006.01)
*H01L 27/088* (2006.01)
(Continued)

(52) U.S. Cl.
CPC .... *H01L 29/66545* (2013.01); *H01L 21/0228* (2013.01); *H01L 21/31111* (2013.01);
(Continued)

(58) Field of Classification Search
CPC ... H01L 29/42; H01L 29/423; H01L 29/4237; H01L 29/42372; H01L 29/66;
(Continued)

(56) References Cited

U.S. PATENT DOCUMENTS

| 9,805,985 B2 | 10/2017 | Liaw |
| 9,929,155 B2* | 3/2018 | Kim ..................... H01L 29/785 |
| 2013/0200450 A1 | 8/2013 | Kusai et al. |

OTHER PUBLICATIONS

Inayoshi, M., et al., "Surface reaction of CF2 radicals for fluorocarbon film formation in SiO2/Si selective etching process," Journal of Vacuum Science & Technology A:Vacuum, Surfaces, and Films, vol. 16, Issue 1, pp. 233-238 (1998).
(Continued)

*Primary Examiner* — Monica D Harrison
(74) *Attorney, Agent, or Firm* — Maschoff Brennan

(57) ABSTRACT

A method includes forming a gate layer over a semiconductor fin; forming a patterned mask over the gate layer; performing a first etching process to pattern the gate layer using the patterned mask as an etch mask, the patterned gate layer comprising a first gate extending across the semiconductor fin; depositing, by using an directional ion beam, a protection layer to wrap around a top surface, a first sidewall and a second sidewall of the first gate, the protection layer extending along the first and second sidewalls of the first gate towards a bottom surface of the first gate without extending to the bottom surface of the first gate on the second sidewall of the first gate; and after depositing the protection layer, performing a second etching process to a portion of the second sidewall of the first gate exposed by the protection layer.

20 Claims, 6 Drawing Sheets

(51) Int. Cl.
*H01L 29/423* (2006.01)
*H01L 21/8234* (2006.01)
*H01L 21/02* (2006.01)
*H01L 21/3213* (2006.01)
*H01L 21/311* (2006.01)

(52) U.S. Cl.
CPC .. *H01L 21/32133* (2013.01); *H01L 21/32139* (2013.01); *H01L 21/823431* (2013.01); *H01L 21/823437* (2013.01); *H01L 21/823468* (2013.01); *H01L 27/0886* (2013.01); *H01L 29/42372* (2013.01)

(58) Field of Classification Search
CPC ............... H01L 29/665; H01L 29/6654; H01L 29/66545; H01L 27/08; H01L 27/088; H01L 27/0886; H01L 21/02; H01L 21/022; H01L 21/0228; H01L 21/32; H01L 21/321; H01L 21/3213; H01L 21/32133; H01L 21/32139; H01L 21/82; H01L 21/823; H01L 21/8234; H01L 21/82343; H01L 21/823431; H01L 21/823437; H01L 21/82346; H01L 21/823468
USPC ........................................................ 257/401
See application file for complete search history.

(56) References Cited

OTHER PUBLICATIONS

Zhang, D and Kushner, M.J., "Investigations of surface reactions during C2F6 plasma etching of SiO2 with equipment and feature scale models,", Journal of Vacuum Science & Technology A: Vacuum, Surfaces, and Films, vol. 19, Issue 2, pp. 524-538 (2001).

* cited by examiner

US 11,075,282 B2

SEMICONDUCTOR STRUCTURE AND FABRICATION METHOD THEREOF

RELATED APPLICATIONS

The present application is a continuation application of U.S. application Ser. No. 16/007,885, filed on Jun. 13, 2018, which is herein incorporated by reference in its entirety.

BACKGROUND

A conventional fabrication process employed in manufacturing semiconductor devices is a gate etching process that is used to form, for example, polysilicon gate, which is typically utilized for a transistor. This gate etching process is essential with regard to device operation and critical dimensions. Various control of the etching process results in benefits, including, for example, enhanced device characteristics, improved device performance, improved device yield, and so on. Thus, an accurate and precise gate etching process used to form desired gate profiles is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
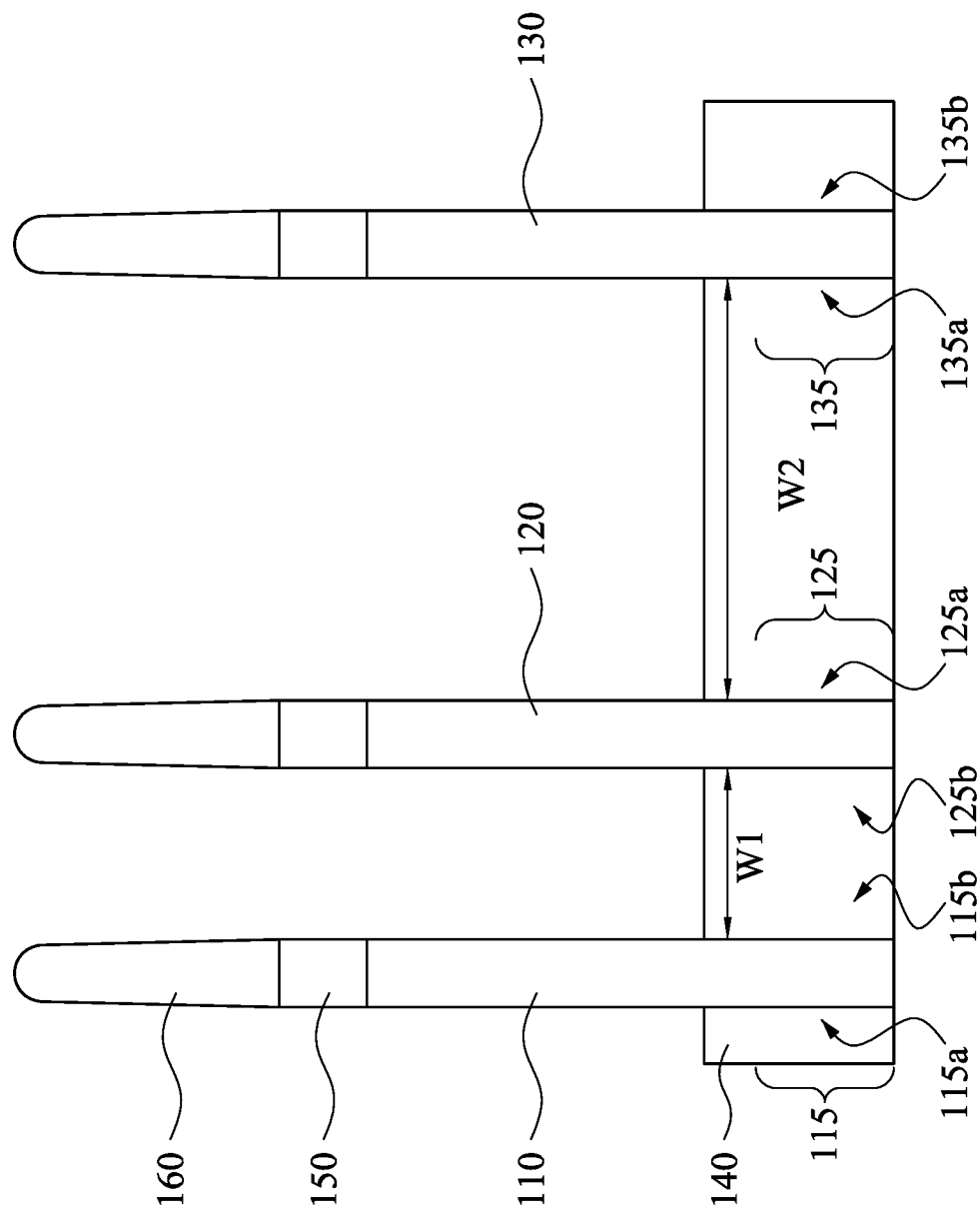
FIG. 1 shows a schematic diagram of a semiconductor structure 100, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is made to FIG. 1. FIG. 1 is a schematic diagram of a semiconductor structure 100, according to some embodiments of the present disclosure. The semiconductor structure 100 includes a first gate 110, a second gate 120, and a third gate 130 that are disposed with respect to a fin structure 140.

For convenience of discussion, FIG. 1 illustrates one first gate 110, one second gate 120, one third gate 130, and one fin structure 140. The amounts of the first gate 110, the second gate 120, the third gate 130, and the fin structure 140 in FIG. 1 are given for illustrative purposes. Various amounts of the first gate 110, the second gate 120, the third gate 130, and the fin structure 140 are within the contemplated scope of the present disclosure.

In some embodiments, the first gate 110, the second gate 120, and the third gate 130 are disposed over the fin structure 140. For illustration in FIG. 1, the first gate 110, the second gate 120, and the third gate 130 are disposed in parallel over the fin structure 140. The second gate 120 is disposed between the first gate 110 and the third gate 130.

In some embodiments, the first gate 110 and the second gate 120 have a spacing W1 therebetween, and the second gate 120 and the third gate 130 have a spacing W2 therebetween. In some embodiments, the spacing W1 is smaller than the spacing W2. In some embodiments, the spacing W1 is approximately smaller than 40 nm (nanometers), and accordingly, the region between the first gate 110 and the second gate is also referred to as a "dense region" or a "device region" in some embodiments. In some embodiments, the spacing W2 is approximately larger than 60 nm, and accordingly, the region between the second gate 120 and the third gate 130 is also referred to as an "iso region" or a "peripheral region".

In some embodiments, the first gate 110, the second gate 120, and the third gate 130 are polysilicon gates. In some other embodiments, the first gate 110, the second gate 120, and the third gate 130 are metal gates. In some embodiments, the materials of the first gate 110, the second gate 120, and the third gate 130 are the same. In some other embodiments, the materials of the first gate 110, the second gate 120, and the third gate 130 are partially the same or different from each other.

In some embodiments, the first gate 110, the second gate 120, and the third gate 130 are dummy polysilicon gates. Types of the first gate 110, the second gate 120, and the third gate 130 are given for illustrative purposes. Various types of the first gate 110, the second gate 120, and the third gate 130 are within the contemplated scope of the present disclosure.

The fin structure 140 is able to be formed by suitable methods. For illustration, the fin structure 140 is formed using one or more photolithography processes, including, for example, double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to perform a patterning process to form the fin structure 140.

In some embodiments, the semiconductor structure 100 further includes a first mask 150 and a second mask 160. For illustration in FIG. 1, the first mask 150 is disposed above the first gate 110, the second gate 120, and the third gate 130. The second mask 160 is disposed above the first mask 150. In some embodiments, the first mask 150 and the second mask 160 are hard masks. In some embodiments, the first mask 150 and the second mask 160 are made of silicon nitride (SiN). The above material of the first mask 150 and the second mask 160 is given for illustrative purposes. Various materials of the first mask 150 and the second mask 160 are within the contemplated scope of the present disclosure.

In some other embodiments, the first mask 150 and the second mask 160 are removed from the semiconductor structure 100. Alternatively stated, a final product including the semiconductor structure 100 does not include the first mask 150 and the second mask 160.

In some embodiments, the first gate 110 has no lateral extension and/or cut facing the second gate 120 with respect to the fin structure 140. For illustration in FIG. 1, a side wall of the first gate 110 facing the second gate 120 has a vertical profile with respect to the fin structure 140.

In some embodiments, the first gate 110 includes a foot portion 115 as illustrated in FIG. 1. For illustration, the foot portion 115 includes a side wall 115*a* and a side wall 115*b* that is opposite to the side wall 115*a* and faces the second gate 120. The side wall 115*a* and the side wall 115*b* are both vertical with respect to the fin structure 140.

In some embodiments, the second gate 120 has no lateral extension and/or cut facing the first gate 110 and the third gate 130 with respect to the fin structure 140. For illustration in FIG. 1, a side wall of the second gate 120 facing the first gate 110 has a vertical profile with respect to the fin structure 140, and a side wall of the second gate 120 facing the third gate 130 has a vertical profile with respect to, for illustration, the fin structure 140.

In some embodiments, the second gate 120 includes a foot portion 125 as illustrated in FIG. 1. For illustration, the foot portion 125 includes a side wall 125*a* that faces the first gate 110, and a side wall 125*b* that is opposite to the side wall 125*a* and faces the third gate 130. The side wall 125*a* and the side wall 125*b* are both vertical with respect to, for illustration, the fin structure 140.

In some embodiments, the third gate 130 has no lateral extension and/or cut facing the second gate 120 with respect to the fin structure 140. For illustration in FIG. 1, a side wall of the third gate 130 facing the second gate 120 has a vertical profile with respect to, for illustration, the fin structure 140.

In some embodiments, the third gate 130 includes a foot portion 135 as illustrated in FIG. 1. For illustration, the foot portion 135 includes a side wall 135*a* that faces the second gate 120, and a side wall 135*b* that is opposite to the side wall 135*a*. The side wall 135*a* and the side wall 135*b* are both vertical with respect to, for illustration, the fin structure 140.

In some embodiments as discussed above with respect to the dense region and the iso region, the foot portions of the gates located at the dense region, including, for example, the first gate 110 and the second gate 120, have side walls vertical to the fin structure 140, and the foot portions of the gates located at the iso region, including, for example, the second gate 120 and the third gate 130, have side walls vertical to the fin structure 140.

In the embodiments as discussed above, the physical profiles of the first gate 110, the second gate 120, and the third gate 130 are identical. The above physical profiles are given for illustrative purposes. Various physical profiles of the first gate 110, the second gate 120, and the third gate 130 are within the contemplated scope of the present disclosure. For example, in various embodiments, the foot portion 135 of the third gate 130 is different from the foot portion 115 of the first gate 110 and the foot portion 125 of the second gate 120, which will be discussed below with reference to FIG. 6.

The above configuration of the semiconductor structure 100 is given for illustrative purposes. Various configurations of the semiconductor structure 100 are within the contemplated scope of the present disclosure.

Figure 2:
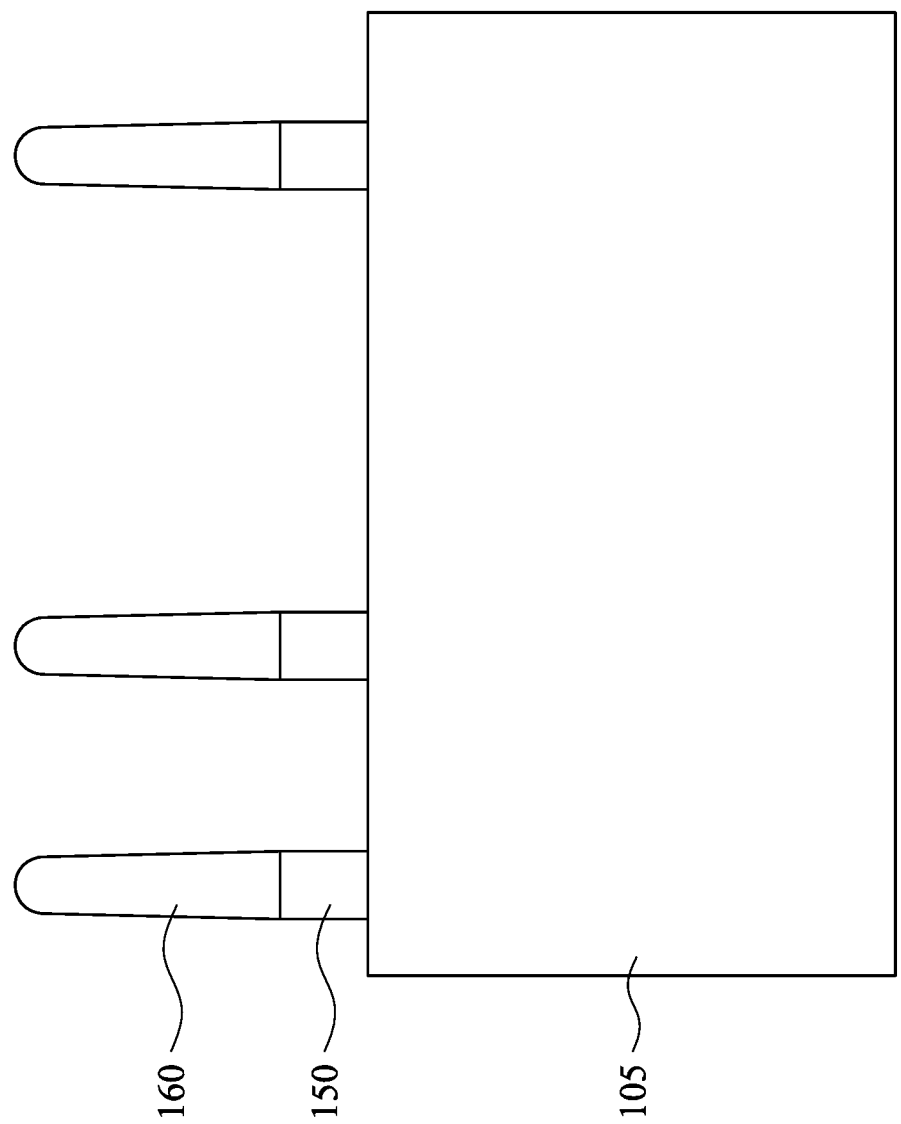
FIGS. 2-4 are diagrams illustrating processes of manufacturing the semiconductor structure 100 in FIG. 1, according to some embodiments of the present disclosure.
Figure 3:
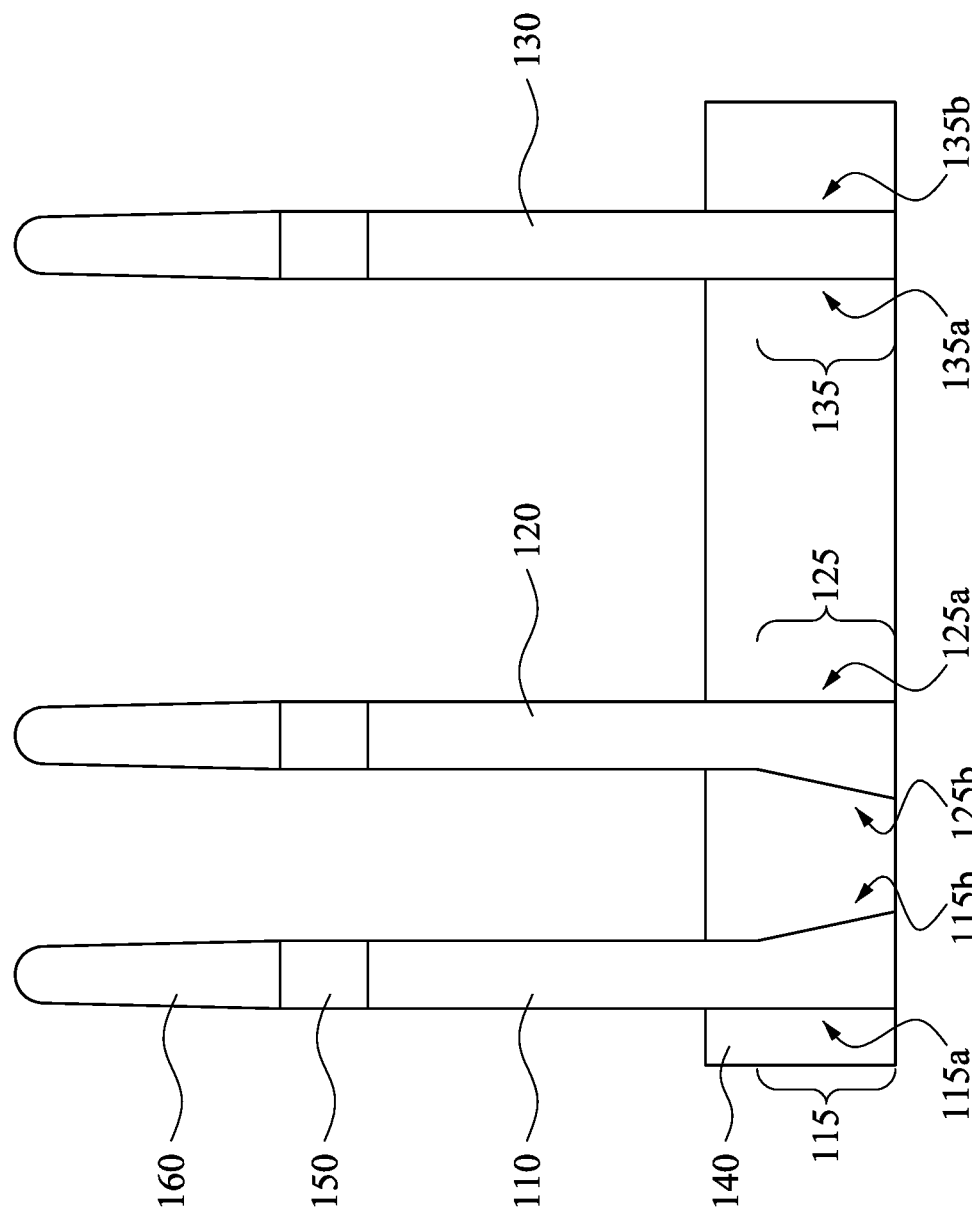
Figure 4:
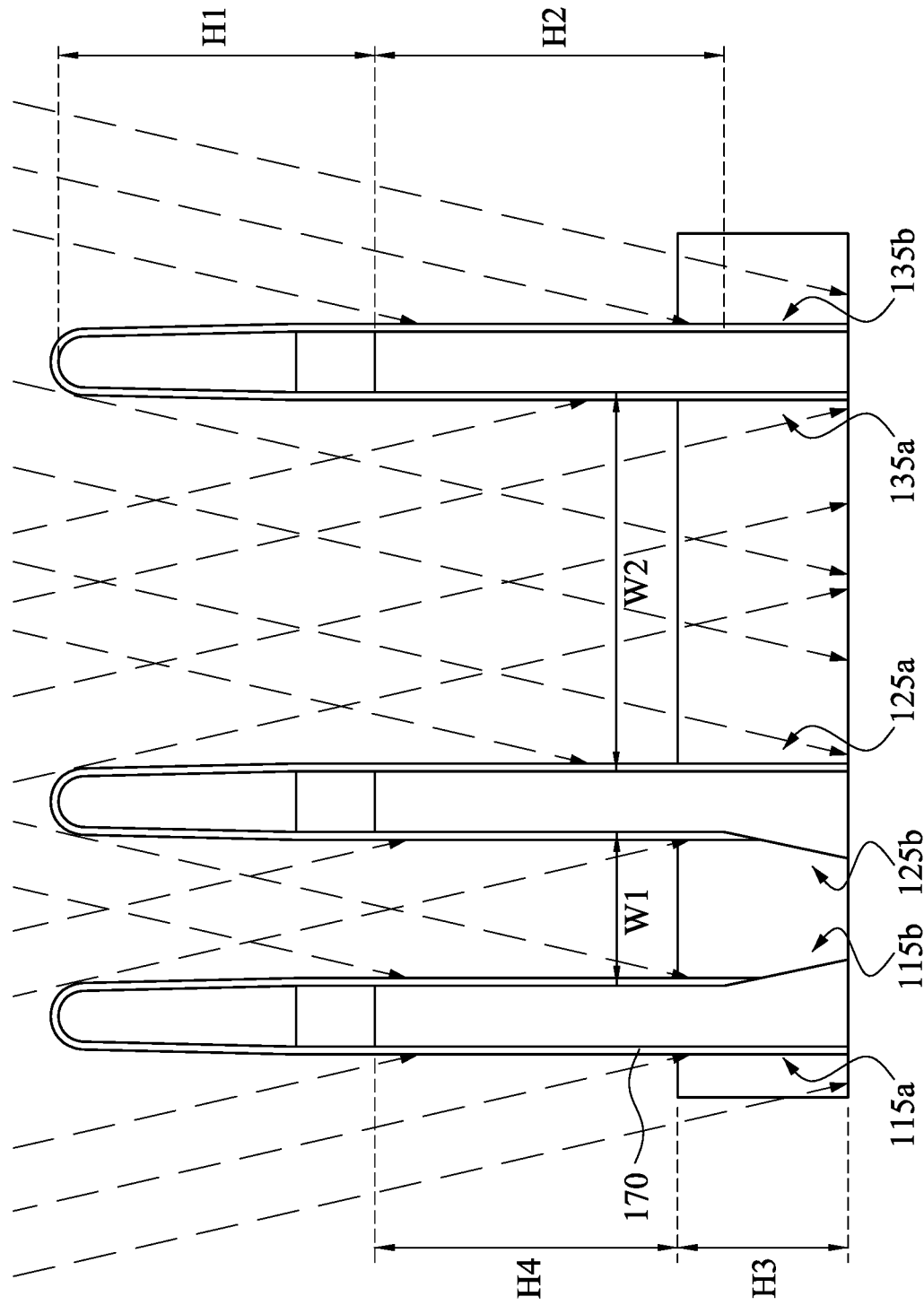

FIGS. 2-4 are diagrams illustrating processes of manufacturing the semiconductor structure 100 in FIG. 1, according to some embodiments of the present disclosure. With respect to the embodiments of FIG. 1, like elements in FIGS. 2-4 are designated with the same reference numbers for ease of understanding. For simplicity, some reference numbers shown in FIG. 1 are not shown in FIGS. 2-4. The processes of manufacturing the semiconductor structure 100 in FIGS. 2-4 are given for illustrative purposes. Various processes of manufacturing the semiconductor structure 100, which are not shown in FIGS. 2-4, are within the contemplated scope of the present disclosure.

Figure 5:
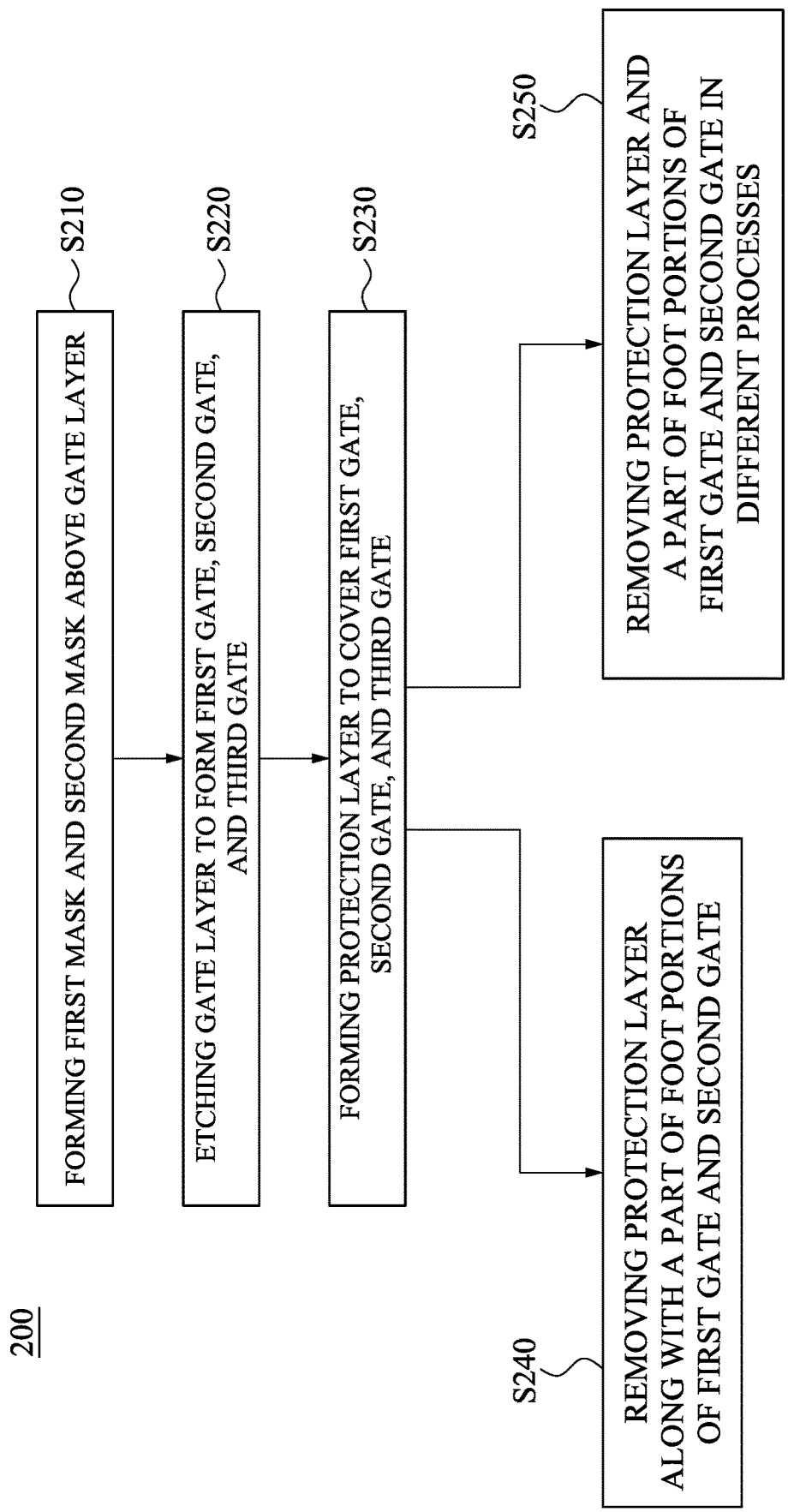
FIG. 5 is a flow chart of a method 200 for manufacturing the semiconductor structure 100 in FIG. 1, according to some embodiments of the present disclosure.

FIG. 5 is a flow chart of a method 200 for manufacturing the semiconductor structure 100 in FIG. 1, according to some embodiments of the present disclosure. The method 200 includes operations S210, S220, S230, and S240. For ease of understanding, the method 200 in FIG. 5 is explained below with reference to FIGS. 2-4.

In operation S210 of FIG. 5, with reference to FIG. 2, the first mask 150 and the second mask 160 are formed above a gate layer 105. In some embodiments, the gate layer 105 is formed of polysilicon. In some embodiments, the first mask 150 and the second mask 160 are formed by depositing layers over the gate layer 105, and patterning the layers. For illustration in FIG. 2, the first mask 150 and the second mask 160 have the same pattern, and these two masks are formed at the same location.

In operation S220 of FIG. 5, with reference to FIG. 3, the gate layer 105 is etched to form the first gate 110, the second gate 120, and the third gate 130. In this process, the gate layer 105 is first etched after the first mask 150 and the second mask 160 are formed. Accordingly, in the embodiments of the gate layer 105 being formed of polysilicon, this process is also referred to as a "first poly etch" process in some embodiments.

In some embodiments, the gate layer 105 is etched under an anisotropic etching process. In some embodiments in FIG. 3, after the gate layer 105 is etched, the first gate 110 and the second gate 120 are formed, and each one of the first gate 110 and the second gate 120 has a footing shape. For illustration in FIG. 3, the foot portion 115 of the first gate 110 and the foot portion 125 of the second gate 120 have lateral extension when the gate layer 105 is etched to form the first gate 110 and the second gate 120.

For another illustration in FIG. 3, the side wall 115*b* has a slope with respect to the side wall 115*a* of the first gate 110, and the side wall 125*b* has a slope with respect to the side wall 125*a* of the second gate 120. Alternatively stated, the side wall 115*a* of the first gate 110 and the side wall 125*a* of the second gate 120 are vertical with respect to, for illustration, the fin structure 140, and the side wall 115*b* of the first gate 110 and the side wall 125*b* of the second gate 120 are not vertical with respect to, for illustration, the fin structure 140.

In some embodiments in FIG. 3, after the gate layer 105 is etched, the third gate 130 is formed, and the third gate 130 has no lateral extension and/or cut. In some other embodiments, the foot portion 135 of the third gate 130 has a vertical profile. For illustration in FIG. 3, the side wall 135*a* and the side wall 135*b* that is opposite to the side wall 135*a* of the third gate 130 are both vertical with respect to, for illustration, the fin structure 140. Alternatively stated, the side wall 135*a* and the side wall 135*b* of the third gate 130 are parallel to each other.

In operation S230 of FIG. 5, with reference to FIG. 4, a protection layer 170 is formed to cover the first gate 110, the second gate 120, and the third gate 130 that are formed in operation S220. In some embodiments in FIG. 4, the protection layer 170 does not cover a part of the foot portion 115 of the first gate 110 and a part of the foot portion 125 of the second gate 120. For illustration in FIG. 4, the protection layer 170 does not cover the side wall 115*b* of the foot portion 115 of the first gate 110 and the side wall 125*b* of the foot portion 125 of the second gate 120.

In some embodiments, the protection layer 170 is formed under a directional deposition process. In some embodiments, the directional deposition process is performed by directing an ion beam with a tilted angle to the first gate 110, the second gate 120, and the third gate 130 as formed in FIG. 3, in order to deposit the protection layer 170. The arrows with dashed lines in FIG. 4 indicate that the ion beam is incident on the first gate 110, the second gate 120, and the third gate 130 to perform the deposition process.

In some embodiments with respect to the dense region as discussed above, with the shadowing effect, after depositing the protection layer 170 on the first gate 110, the side wall 115*a* is covered by the protection layer 170, but the side wall 115*b* is not covered by the protection layer 170. Explained in a different way, according to the incident angle of the ion beam with respect to the first gate 110 and the second gate 120, for illustration in FIG. 4, the side wall 115*b* is shielded based on the shadowing effect in the dense region as discussed above, and accordingly, there is no protection layer 170 formed on the side wall 115*b*.

In some embodiments with respect to the dense region as discussed above, with the shadowing effect, after depositing the protection layer 170 on the second gate 120, the side wall 125*a* is covered by the protection layer 170, but the side wall 125*b* is not covered by the protection layer 170. Explained in a different way, according to the incident angle of the ion beam with respect to the first gate 110 and the second gate 120, for illustration in FIG. 4, the side wall 125*b* is shielded based on the shadowing effect in the dense region, and accordingly, there is no protection layer 170 formed on the side wall 125*b*.

In some embodiments with respect to the iso region as discussed above, after depositing the protection layer 170 on the third gate 130, the side wall 135*a* and the side wall 135*b* are both covered by the protection layer 170. Explained in a different way, there is no shadowing effect affecting the deposition on the foot portion 135 of the third gate 130 at the iso region, for illustration in FIG. 4.

In some embodiments, depositing the protection layer 170 is performed by atomic layer deposition (ALD) with ion activation or precursor. The ion activation or precursor is deposited with the incident angle to perform the directional deposition. In some other embodiments, depositing the protection layer 170 is performed by ion induced polymer deposition. For example, Argon ion (Ar+) is used in order to form Ar+ enhanced passivation as the protection layer 170. For illustration, the ions are deposited with the incident angle to perform the directional deposition. In alternative embodiments, depositing the protection layer 170 is performed by ion induced polysilicon oxidation. The semiconductor structure as discussed above is bombarded with ions with the incident angle to perform the directional deposition, and the bombarded part of the gates, including, for illustration, the first gate 110, the second gate 120, and the third gate 130, are to be oxidized. The above depositions to form the protection layer 170 are given for illustrative purposes. Various depositions to form the protection layer 170 are within the contemplated scope of the present disclosure.

For another illustration in FIG. 4, a height H1 indicates a total height of the hard mask which includes, for illustration, the first mask 150 and the second mask 160 as discussed above, and a height H2 indicates the height of the gates which include, for illustration, the first gate 110, the second gate 120, and the third gate 130, above their respective foot portions as discussed above.

For another illustration in FIG. 4, the spacing W1 represents a distance between two immediately adjacent gates, including, for illustration, the first gate 110 and the second gate 120 in the dense region as discussed above. The spacing W2 represents a distance between two immediately adjacent gates, including, for illustration, the second gate 120 and the third gate 130, in the iso region as discussed above. In some embodiments, the incident angle of the ion beam configured to perform the directional deposition is associated with the height H1, the height H2, and the spacing W1. In some other embodiments, the incident angle of the ion beam configured to perform the directional deposition is associated with an aspect ratio AR. The aspect ratio AR is obtained from a following equation (1)

$$AR = \frac{(H1 + H2)}{W1}. \tag{1}$$

In some embodiments, the above incident angle is in a range of approximately −20° and approximately +20°. In some other embodiments, the incident angle of the ion beam with respect to the first gate 110 and the second gate 120 is in a range of approximately 9° and approximately 10°, that is included by the first gate 110 and the direction of the ion beam. In some embodiments, regarding the above angles, 0° is referred to as a normal incidence of the ion beam, and negative and positive signs are referred to as different incidence directions. For illustration, when a positive angle indicates the incidence of the ion beam from left to right on FIG. 4, a negative angle indicates the incidence of the ion beam from right to left on FIG. 4.

In some embodiments, the height H1 is in a range of approximately 90-130 nm. In some embodiments, the height H2 is in a range of approximately 70-130 nm. In some embodiments, the spacing W1 and the spacing W2 are in the ranges as discussed in the embodiments of FIG. 1. In some embodiments, the height H1 is in a range of approximately.

For further illustration in FIG. 4, a height H3 indicates a height of the fin structure 140, and a height H4 indicates a height of each of the first gate 110, the second gate 120, and the third gate 130 above the fin structure 140. In some embodiments, the height H3 is in a range of approximately 40-60 nm. In some embodiments, the height H4 is in a range of approximately 60-120 nm.

In operation S240 of FIG. 5, with reference to FIG. 1, the protection layer 170 as illustrated in FIG. 4 and portions of the first gate 110 and the second gate 120 are removed. In some embodiments, a part of the foot portion 115 of the first gate 110 and the foot portion 125 of the second gate 120, that are not covered by the protection layer 170, are removed along with the protection layer 170, for illustration, in single one process, in order to form the first gate 110, the second gate 120, and the third gate 130 as discussed above in the embodiments of FIG. 1.

In operation S250 of FIG. 5, with reference to FIG. 1, the protection layer 170 as illustration in FIG. 4 and portions of the first gate 110 and the second gate 120 are removed. Comparing to S240, in alternative embodiments, a part of the foot portion 115 of the first gate 110 and the foot portion 125 of the second gate 120, that are not covered by the protection layer 170, are not removed along with the protection layer 170. Alternatively stated, a part of the foot portion 115 of the first gate 110, a part of the foot portion 125 of the second 120, and the protection layer 170 are removed in different processes. For illustration, a part of the foot portion 115 of the first gate 110 and a part of the foot portion 125 of the second 120 are removed, and afterwards, the protection layer 170 is removed. Thus, the structure of embodiment shown in FIG. 1 is formed.

For further illustration of FIG. 4, the part of the foot portion 115 corresponding to the side wall 115b is removed. Accordingly, the side wall 115b of the foot portion 115 of the first gate 110 becomes vertical with respect to the fin structure 140 and parallel to the side wall 115a of the foot portion 115 of the first gate 110.

Correspondingly, the part of the foot portion 125 corresponding to the side wall 125b is removed. Accordingly, the side wall 125b of the foot portion 125 of the second gate 120 becomes vertical with respect to the fin structure 140 and parallel to the side wall 125a of the foot portion 125 of the second gate 120.

Any portion of the third gate 130 is not removed at this stage because the third gate 130 is entirely covered by the protection layer 170. Accordingly, after the protection layer 170 is removed, the third gate 130 remains the same.

In some embodiments, the foot portions of the first gate 110 and the second gate 120 are removed under an etching process. This etching process is performed after the "first poly etch" process as discussed above. Accordingly, in the embodiments of the gate layer 105 being formed of polysilicon, this etching process is also referred to as a "second poly etch" process. As discussed above, this etching process is performed to remove the foot portions of the first gate 110 and the second gate 120, and accordingly, this etching process is also referred to as a "de-footing" process in some embodiments. The above processes of removing a part of the foot portions of the first gate 110 and the second gate 120 are given for illustrative purposes. Various processes of removing a part of the foot portions of the first gate 110 and the second gate 120 are within the contemplated scope of the present disclosure.

In some embodiments, the above process of etching the foot portions of the first gate 110 and the second gate 120 is a wet etching, gas phase etching, plasma etching, remote plasma etching, and/or isotropic etching process. The process of etching the foot portions of the first gate 110 and the second gate 120 is given for illustrative purposes. Various processes of etching the foot portions of the first gate 110 and the second gate 120 are within the contemplated scope of the present disclosure.

In some embodiments, a hydrofluoric acid (dilute HF) solution is used during the process of removing the protection layer 170. The above etchant used to remove the protection layer 170 is given for illustrative purposes. Various etchants used to remove the protection layer 170 are within the contemplated scope of the present disclosure.

In some approaches, when gates in the dense region as discussed above are etched in order to have foot portions with vertical profiles, gates in the iso region as discussed above are over etched in the same process. Accordingly, the gates in the iso region do not have foot portions with vertical profiles and would have unnecessary cuts.

Compared to the above approaches, in the embodiments of the present disclosure, the protection layer 170 is formed to cover the desired foot portions of the gates in the dense region by, for illustration, the directional deposition. Accordingly, foot portions of the gates in both of the dense region and the iso region have vertical profiles. Moreover, with covering the desired foot portions of the gates by the protection layer 170, an isotropic etching process with, for example, low ion energy, is able to be performed. Accordingly, loss of fin structure, which occurs during the etching process, is able to be prevented.

The above illustrations include exemplary operations, but the operations are not necessarily performed in the order shown. Operations may be added, replaced, changed order, and/or eliminated as appropriate, in accordance with the spirit and scope of various embodiments of the present disclosure. For example, in various embodiments, in addition to the operations in FIG. 5, after the protection layer 170 is removed, the first hard mask 150 and the second hard mask 150 are removed.

The above configuration of the semiconductor structure 100 is given for illustrative purposes. Various configurations of the semiconductor structure 100 are with the contemplated scope of the present disclosure. For example, in various embodiments, there are more gates disposed between the first gate 110 and the second gate 120. For another example, in alternative embodiments, the foot portions of the first gate 110 and the second gate 120 have various configurations, which are discussed below with reference to FIG. 6.

Figure 6:
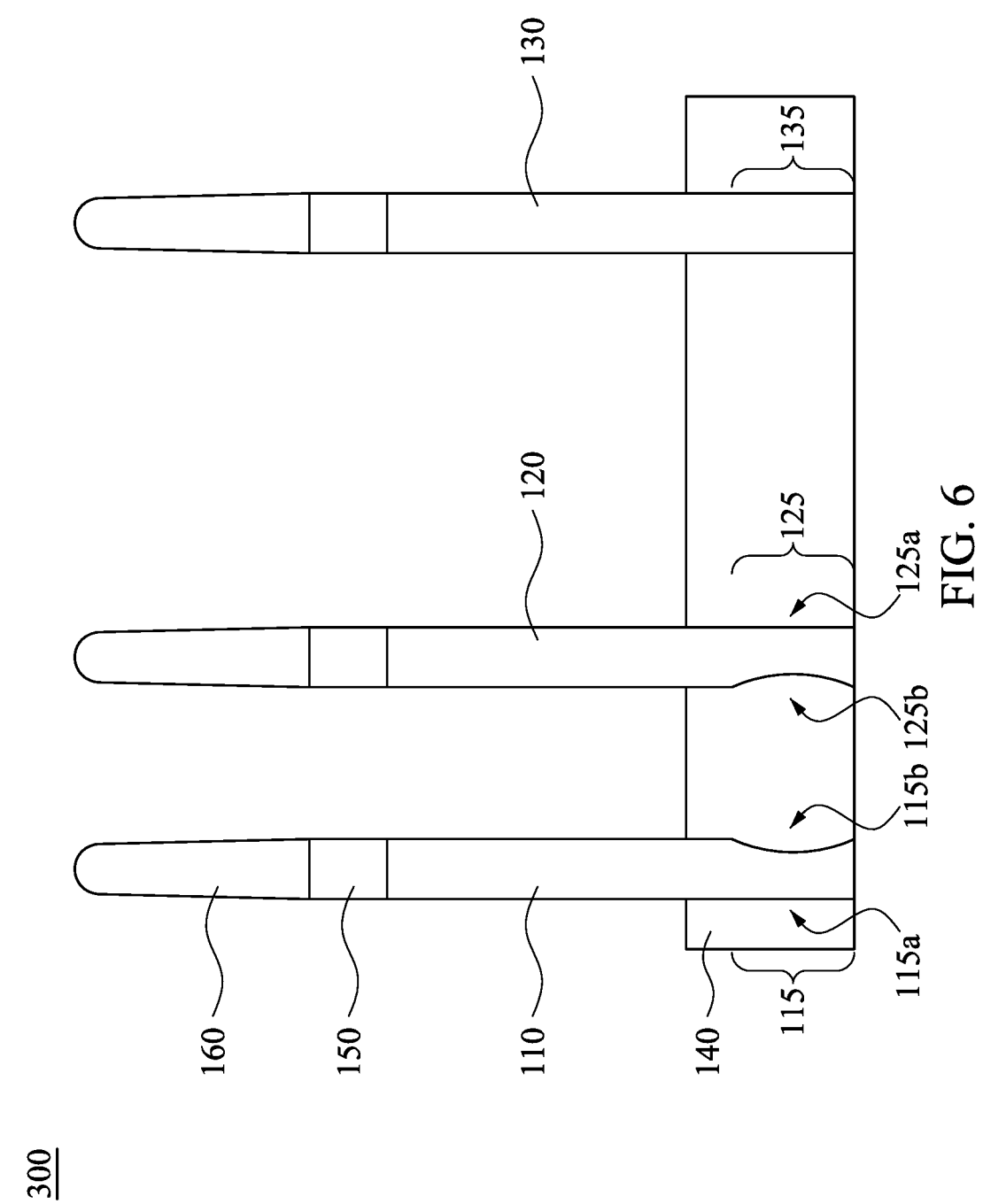
FIG. 6 is a schematic diagram of a semiconductor structure 300, according to alternative embodiments of the present disclosure.

FIG. 6 is a schematic diagram of a semiconductor structure 300, according to alternative embodiments of the present disclosure. With respect to the embodiments of FIG. 1, like elements in FIG. 1 are designated with the same reference numbers for ease of understanding. For simplicity, some reference numbers shown in FIG. 1 are not shown in FIG. 6.

In some embodiments, compared to the embodiments of FIG. 1, each one of the foot portion 115 of the first gate 110 and the foot portion 125 of the second gate 120 has a cut. For illustration in FIG. 6, the side wall 115b of the first gate 110 is not parallel to the side wall 115a, and is not vertical with respect to the fin structure 140. The side wall 125b of the second gate 120 is not parallel to the side wall 125a, and is not vertical with respect to the fin structure 140. The foot portion 115 of the first gate 110, corresponding to the side wall 115b, has a cut facing the second gate 120. The foot portion 125 of the second gate 120, corresponding to the side wall 125b, has a cut facing the first gate 110.

Compared to the aforementioned process and operations, in alternative embodiments of forming the semiconductor structure 300 in FIG. 6, the operation S240 in FIG. 5 is performed to remove more of the foot portion 115 of the first gate 110 and the foot portion 125 of the second gate 120.

With the semiconductor structure 300 in FIG. 6, the foot portions of the gates would have better isolation for the semiconductor structure 300 in the dense region as discussed above, because the foot portions of the gates, including, for illustration, the first gate 110 and the second gate 120, in the dense region, are more spaced apart from each other, compared to those illustrated in FIG. 1.

In some embodiments, a method includes forming a gate layer over a semiconductor fin; forming a patterned mask over the gate layer; performing a first etching process to pattern the gate layer using the patterned mask as an etch mask, the patterned gate layer comprising a first gate extending across the semiconductor fin; depositing, by using an directional ion beam, a protection layer to wrap around a top surface, a first sidewall and a second sidewall of the first gate, the protection layer extending along the first and second sidewalls of the first gate towards a bottom surface of the first gate without extending to the bottom surface of the first gate on the second sidewall of the first gate; and after depositing the protection layer, performing a second etching process to a portion of the second sidewall of the first gate exposed by the protection layer.

In some embodiments, a method includes forming a gate layer over a semiconductor fin; patterning the gate layer into a first gate and a second gate extending perpendicular to the semiconductor fin; depositing a protection layer on the first gate and the second gate by using a directional ion beam tilted at a non-zero angle relative to sidewalls of the first and second gates, such that lower portions of the sidewalls of the first and second gates are shielded from the directional ion beam; and after depositing the protection layer, etching the lower portions of the sidewalls of the first and second gates.

In some embodiments, a semiconductor device includes a fin structure extending along a first direction, and first, second and third gates extending across the fin structure along a second direction perpendicular to the first direction. The second gate is laterally between the first gate and the third gate. The second gate is laterally spaced from the first gate by a first non-zero distance and from the third gate by a second non-zero distance greater than the first non-zero distance. A first sidewall of the second gate facing the first gate is more curved than a second sidewall of the second gate facing the third gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate layer over a semiconductor fin;
   forming a patterned mask over the gate layer;
   performing a first etching process to pattern the gate layer using the patterned mask as an etch mask, the patterned gate layer comprising a first gate extending across the semiconductor fin;
   depositing, by using a directional ion beam, a protection layer to wrap around a top surface, a first sidewall and a second sidewall of the first gate, the protection layer extending along the first and second sidewalls of the first gate towards a bottom surface of the first gate without extending to the bottom surface of the first gate on the second sidewall of the first gate; and
   after depositing the protection layer, performing a second etching process to a portion of the second sidewall of the first gate exposed by the protection layer.

2. The method of claim 1, wherein the second etching process is performed using a diluted hydrofluoric acid solution.

3. The method of claim 2, wherein the protection layer is removed by the diluted hydrofluoric acid solution.

4. The method of claim 1, wherein the protection layer is removed by the second etching process.

5. The method of claim 1, further comprising:
   after performing the second etching process, removing the protection layer.

6. The method of claim 1, wherein the direction ion beam includes argon ions.

7. The method of claim 1, wherein depositing the protection layer comprises oxidizing a portion of the first gate by using the ion beam.

8. The method of claim 1, where the first etching process is an anisotropic etching process.

9. The method of claim 1, wherein the protection layer is further deposited on a second gate in the patterned gate layer, and the protection layer covers a greater surface area on the second gate than on the first gate.

10. The method of claim 9, wherein the second gate remains substantially intact during the second etching process.

11. The method of claim 9, wherein before the second etching process, the first gate has a foot portion wider than a foot portion of the second gate, and the second etching process is performed such that the foot portion of the first gate becomes narrower than the foot portion of the second gate.

12. A method, comprising:
   forming a gate layer over a semiconductor fin;
   patterning the gate layer into a first gate and a second gate extending perpendicular to the semiconductor fin;
   depositing a protection layer on the first gate and the second gate by using a directional ion beam tilted at a non-zero angle relative to sidewalls of the first and second gates, such that lower portions of the sidewalls of the first and second gates are shielded from the directional ion beam; and
   after depositing the protection layer, etching the lower portions of the sidewalls of the first and second gates.

13. The method of claim 12, wherein the protection layer has a greater thickness on upper portions of the sidewalls of the first and second gates than on the lower portions of the sidewalls of the first and second gates.

14. The method of claim 12, wherein the lower portions of the sidewalls of the first and second gates are free from coverage by the protection layer.

15. The method of claim 12, further comprising:
removing the protection layer simultaneously with etching the lower portions of the sidewalls of the first and second gates.

16. The method of claim 12, further comprising:
removing the protection layer after etching the lower portions of the sidewalls of the first and second gates.

17. The method of claim 12, wherein the patterned gate layer has a third gate separated from the second gate by a distance greater than a distance between the first gate and the second gate, the protection layer is further deposited on the third gate, and the protection layer covers a greater surface area on the third gate than on the first gate and the second gate.

18. A semiconductor device, comprising:
a fin structure having a lengthwise direction; and
first, second and third gates extending across the fin structure and arranged along the lengthwise direction of the fin structure,
wherein when viewed in a cross section taken along the lengthwise direction of the fin structure, the second gate is laterally between the first gate and the third gate, the second gate is laterally and physically separated from the first gate by a first non-zero distance and from the third gate by a second non-zero distance greater than the first non-zero distance, and a first sidewall of the second gate facing the first gate and physically discontinuous from the first gate is more curved than a second sidewall of the second gate facing the third gate.

19. The semiconductor device of claim 18, wherein the first sidewall of the second gate has a foot portion having a concave shape when viewed in the cross section taken along the lengthwise direction of the fin structure.

20. The semiconductor device of claim 18, wherein the first gate has a foot portion with a concave sidewall facing the second gate.

* * * * *